United States Patent [19]
Schlaiss

[11] Patent Number: 5,929,518
[45] Date of Patent: Jul. 27, 1999

[54] CIRCUIT BOARD AND METHOD

[75] Inventor: Andrew J. Schlaiss, Tempe, Ariz.

[73] Assignee: Motorola, Inc., Schaumburg, Ill.

[21] Appl. No.: 08/901,525

[22] Filed: Jul. 20, 1997

[51] Int. Cl.[6] .......................... H01L 23/34; H01L 27/15; H01L 31/0232; H01L 31/0203
[52] U.S. Cl. .............................. 257/712; 257/81; 257/99; 257/432; 257/433; 257/415
[58] Field of Search ............................... 257/81, 99, 432, 257/433, 415, 712

[56] References Cited

U.S. PATENT DOCUMENTS

| | | |
|---|---|---|
| 4,706,164 | 11/1987 | L'Henaff et al. |
| 4,809,134 | 2/1989 | Tustaniwskyj et al. |
| 4,945,400 | 7/1990 | Blonder et al. |
| 5,262,921 | 11/1993 | Lamers . |
| 5,522,002 | 5/1996 | Chur et al. |
| 5,611,006 | 3/1997 | Tabuchi . |

*Primary Examiner*—Stephen D. Meier
*Attorney, Agent, or Firm*—Robert F. Hightower

[57] ABSTRACT

A circuit board (10, 50, 70) and method transport a conduction medium (75) through the circuit board for operating a semiconductor device (16, 60, 77, 79) supported on a surface (15, 62, 82) of the circuit board. A medium transport cavity (20, 36, 54, 80) is formed in the circuit board such that a portion (36, 54, 80) runs parallel to the surface, and therefore has a length greater than the thickness of the circuit board. The conduction medium can include air, a coolant fluid, or an optical fiber, which can transport energy such as pressure/vacuum, sound, heat or light from an external source to the semiconductor device.

17 Claims, 3 Drawing Sheets

CIRCUIT BOARD AND METHOD

BACKGROUND OF THE INVENTION

The present invention relates in general to semiconductor devices, and more particularly to circuit boards for supporting semiconductor devices.

Electronic systems often use printed circuit boards to mount semiconductor devices for structural support, interconnection, and connecting to other system components. For high frequency systems, the semiconductor devices typically are soldered directly to wiring traces on the board to minimize signal degradation from inductive and capacitive parasitics caused by excess lead lengths. The circuit boards are fabricated from a substrate material which is mechanically rugged and has the desired dielectric properties. A typical circuit board comprises multiple layers, each of which has a surface which can include wiring traces for interconnecting system components. Traces on one layer can be connected to a trace on a different layer by means of a via to allow conduction perpendicular to the surfaces having wiring traces. The thickness of a layer can be selected so that the wiring traces operate as a waveguide or transmission line to propagate high frequency signals.

Many prior art systems insert a semiconductor device in a socket to perform qualification, reliability, or other long term testing, which allows defective devices to be easily identified and replaced. However, the use of sockets makes it more difficult to identify defective devices in the first place because the socket leads have the effect of extending the lead length of the semiconductor device, which degrades signals and results in the test environment being unrepresentative of the actual system operation.

Other prior art systems avoid excess lead lengths by soldering the devices directly to the board for testing. However, when a defective device is found, the device must be desoldered from the board and replaced, a time consuming and expensive process which can damage the printed circuit board or other system components.

Hence, there is a need for a circuit board and method of testing which provides a reliable yet temporary connection to system components without requiring excess lead lengths or the need to solder the semiconductor device to the circuit board.

DETAILED DESCRIPTION OF THE DRAWINGS

Figure 1:
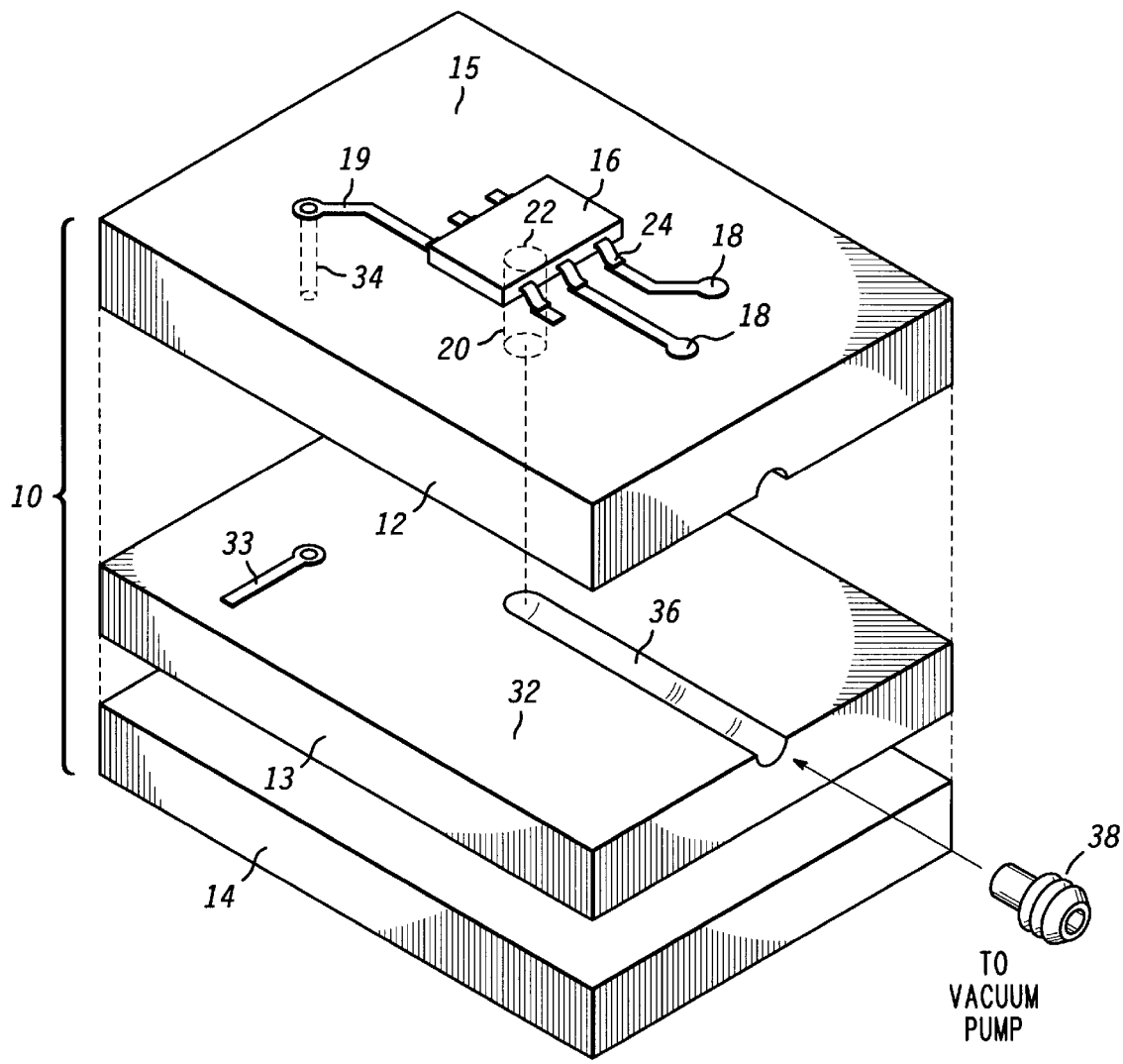
FIG. 1 is an exploded isometric view of a circuit board.

FIG. 1 is an exploded isometric view of a printed circuit board 10 used for testing a semiconductor device 16 such as an integrated circuit, transistor, diode, or other semiconductor device. Circuit board 10 typically is a layered structure fabricated by laminating and joining together substrate layers 12, 13 and 14 with an adhesive. Layers 12–14 are formed from a standard circuit board substrate material such as G10 or FR4 glass-epoxy (often referred to as fiberglass), teflon-glass, or ceramic. The composition of layers 12–14 is selected by the degree of structural durability desired for the application. For high frequency applications, the dielectric properties of the material also are taken into account because certain interconnect traces may operate as waveguides or transmission lines with fixed spacing requirements. Circuit board 10 is shown as having a plurality of representative printed wiring traces 18 and 19 formed on surface 15 of layer 12 as well as a representative trace 33 formed on surface 32 of layer 13. It is understood that circuit board 10 can alternatively be formed with any number of layers, including a single layer, and that wiring traces can be formed on any layer, including all of the layers.

Wiring traces on different layers are electrically interconnected using standard interlayer via openings. In particular, trace 19 is interconnected with trace 33 by means of a via which is formed by boring a hole 34 through layer 12 as shown. Hole 34 is lined or filled with a conductive metal such as solder to provide electrical conductivity between traces 19 and 33. It is apparent from its structure perpendicular to surface 15 that the length of a via cannot exceed the overall thickness of circuit board 10.

Many semiconductor devices are responsive not only to electrical signals carried on wiring traces and vias, but the devices also interact with stimuli which are not readily transported on wiring traces. For example, such a device can interact with energy in the form of light, pressure/vacuum, sound, heat, etc., which is efficiently transported to the device in a conduction medium disposed within a medium transport cavity formed in the circuit board. Examples of such conduction media include air for transporting pressure/vacuum, sound or heat; a coolant fluid for transporting heat; an optical fiber for transporting light, or another type of suitable material which can couple such stimuli to a semiconductor device.

Semiconductor device 16 is mounted or supported on surface 15 and electrically connected through a plurality of leads 24 to printed wiring traces 18. Device 16 is mounted over a through hole 20 bored in layer 12 perpendicular to surface 15 to form part of a medium transport cavity which interacts with semiconductor device 16 through an opening 22. Another portion of the medium transport cavity is formed by milling a channel 36 in layer 13 to run parallel to surface 15. In one embodiment, layer 13 has a thickness of 0.2 centimeters, from which channel 36 is milled or routed to a depth of approximately 0.1 centimeters. In the present example, the length of the medium transport cavity exceeds 1.5 centimeters from a surface of circuit board 10. Therefore, the medium transport cavity extends for a distance greater than the thickness of circuit board 10.

The formation of channel 36 in circuit board 10 is accomplished using standard circuit board fabrication equipment such as milling and routing tools which typically are controlled by a computer executing a software program. The size of channel 36 is varied by adjusting the depth or width of the milling or routing tool. Channel 36 can be formed to a depth greater than 0.2 centimeters by milling through the entire cross-section of layer 13, or through multiple adjacent layers of circuit board 10. Adjacent layers are joined with a laminating adhesive to seal channel 36 when circuit board 10 is fabricated. Where channel 36 runs in a straight line from a surface of circuit board 10, channel 36 also can be formed by drilling or boring into circuit board 10. Channel 36 is aligned with hole 20 to form a continuous cavity for transporting a force or energy through the conduction medium. In particular, the cavity formed by hole 20 and channel 36 couples a vacuum force to draw semiconductor device into close contact with traces 18–19.

Fennel 38 is disposed at an opening of channel 36 to receive a vacuum from an external vacuum pump and is secured by gluing or threading. In the testing embodiment of FIG. 1, vacuum is applied through a vacuum line (not shown) connected to fennel 38. Once leads 24 are aligned with the appropriate traces 18 and 19, vacuum is applied to fennel 38 and transported through the medium conduction cavity (channel 36 and hole 20) and coupled through opening 22 to draw semiconductor device 16 toward surface 15. The vacuum produces a force which holds semiconductor device 16 in place to provide a low contact resistance between leads 24 and traces 18 and 19. The vacuum force also increases the coefficient of friction of leads 24 to maintain alignment with traces 18 and 19 until testing is completed. Where semiconductor device 16 does not have a flat bottom surface, a vacuum seal is provided by taping semiconductor device 16 to surface 15 or by applying a paste to the bottom of device 16.

The above described testing system functions to temporarily connect device 16 to circuit board 10 without being subjected to the drawbacks of the prior art. More particularly, the vacuum force provides a low contact resistance without the need to solder device 16 directly to circuit board 10. Therefore, device 16 can be released without damaging circuit board 10 or other components by merely turning off the vacuum. Hence, sockets are not needed, so that signal degradation due to the introduction of parasitic components from excess length on leads 24 is avoided.

Channel 36 runs parallel to surface 15, so that the medium transport cavity (20, 36) has a length which exceeds the thickness of circuit board 10 without significantly reducing the vacuum force appearing at semiconductor device 16, so that the location of channel 36 can be determined after placing wiring traces 18 and 19 and via 34. Hence, a high level of electrical performance of the system can be attained by optimizing the placement of critical electrical nodes and routing channel 36 to avoid moving the critical nodes so as to not degrade the electrical operation of the system. Where appropriate, different portions of channel 36 can be formed on different layers 12–14 and interconnected with interlayer holes so as to avoid the need to electrically modify circuit board 10, giving the present invention a high degree of flexibility in distributing the vacuum without changing electrical operation. For example, wiring traces and vias can be disposed to minimize the length of critical circuit paths while winding channel 36 around the vias to avoid moving those critical paths.

The capability of routing a pressure or vacuum through a circuit board to a semiconductor device provides an economical means of coupling a harsh environment to the semiconductor device while protecting the device. For example, a semiconductor pressure sensor can be used to sense pressure in the harsh environment of an automobile engine. The circuit board is disposed in the engine to couple the pressure to the pressure sensor through a medium transport cavity formed in the circuit board. The semiconductor pressure sensor is disposed on the circuit board external to the harsh environment, and is mounted over an opening in the cavity using a structure similar to that shown in FIG. 1. The semiconductor pressure sensor thereby can sense the pressure without being subjected to the harsh automobile environment.

Figure 2:
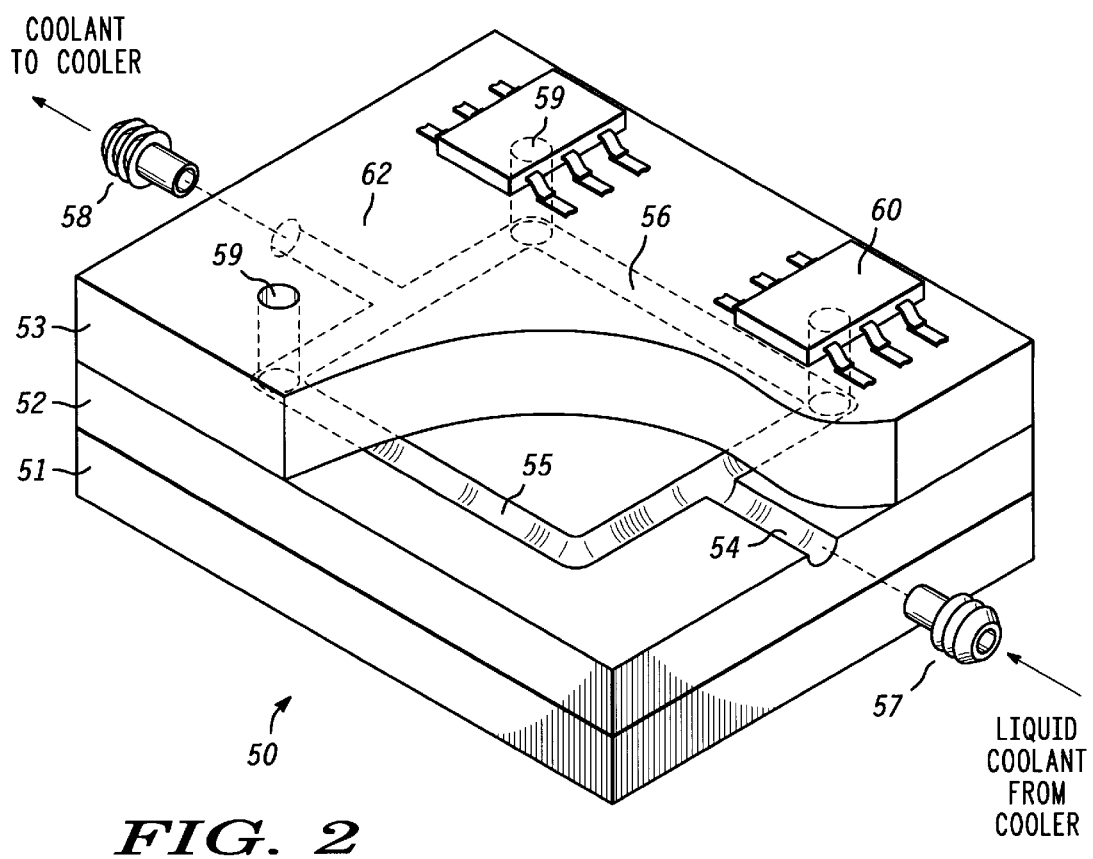
FIG. 2 is a partially cut away isometric view of another circuit board.

FIG. 2 shows a partially cut away isometric view of a circuit board 50 for supporting semiconductor devices 60, including layers 51, 52 and 53. A medium transport cavity 54 is formed as described above in the interior of circuit board 50 to transport a liquid coolant such as polytetrafluoroethylene, ethylene glycol, or water to semiconductor devices 60 to remove dissipated heat. Medium transport cavity 54 is configured with branches 55 and 56 as shown to function as a manifold in which coolant enters at connector 57 and exits the manifold at connector 58. The liquid coolant functions as a conduction medium to transport heat energy from semiconductor devices 60. Heat is removed from the coolant by an external cooling apparatus such as a radiator or refrigeration compressor (not shown) before recirculating coolant to cavity 54.

Cavity 54 includes holes 59 bored through layer 53 as shown to comprise a portion of cavity 54 to reduce thermal resistance by transporting coolant closer to semiconductor devices 60. Holes 59 are capped with copper plugs (not shown) or sealed off with a metallic or other thermally conductive material. For example, most semiconductor devices that dissipate a large amount of heat are fabricated with a metallic bottom used to conduct heat away from the semiconductor. Such devices are mounted on surface 62 by using a wave soldering process in which solder is made to flow under a semiconductor device to thermally couple the device to an underlying copper trace. Standard wave soldering processes utilize a thickness of solder sufficient to plug the underlying hole 59 to prevent liquid coolant from leaking out of cavity 54. The high thermal conductivity of solder provides an excellent thermal path between the semiconductor device and the liquid coolant. In some applications, cavity 54 can alternatively be formed just below surface 62 without the need to bore holes 59 where the thermal coupling between devices 60 and the liquid coolant is adequate to remove the necessary amount of heat.

Cavity 54 has openings for disposing a coolant inlet connector 57 and an outlet connector 58 as shown. However, it is apparent that such openings can be made on any surface of circuit board 50. By configuring cavity 54 as a manifold, multiple devices can be cooled while using one inlet connector 57 and one outlet connector 58 for coupling to the external cooling apparatus. As shown in FIG. 2, a portion of semiconductor devices 60 are cooled by coolant in each of the parallel paths 55–56 through circuit board 50 to ensure a more uniform coolant temperature at each semiconductor device 60. Parallel paths 55–56 are formed by running at least a portion of cavity 54 parallel to surface 64, where semiconductor devices 60 are mounted. Cavity 54 is formed during the fabrication of circuit board 50 by using numerically controlled machining tools which are standard equipment for manufacturing circuit boards.

The portion of cavity 54 that runs parallel to surface 62 results in a length of cavity 54 which exceeds the thickness of circuit board 50 without substantially reducing the cooling efficiency of cavity 54. The path of cavity 54 typically is determined after the placement of wiring traces and vias of circuit board 50 has been optimized to ensure that circuit board 50 has a high electrical performance level. Portions of cavity 54 can be disposed on different layers 51–53 as required to avoid electrical connections such as vias. Therefore, the present invention has the advantage of allowing greater flexibility in transporting coolant to semiconductor devices 60 without affecting the electrical characteristics of semiconductor devices 60. For example, wiring traces and vias can be placed in circuit board 50 to minimize the length of critical circuit paths while winding cavity 54 around the vias to avoid modifying those critical paths.

The cooling capacity can be increased by reducing the temperature or increasing the flow rate of coolant. Such adjustments are made external to circuit board 50 to provide virtually any level of cooling without increasing the space between components, as is necessary when cooling is accomplished with heat sinks. For example, for circuit boards operating at a high frequency, e.g., about 3.0 gigahertz, many wiring traces are spaced to operate as transmission lines. If the circuit boards are made from a ceramic having a high dielectric constant, spacing between traces, and therefore between semiconductor devices, could be reduced even further if it were not for the need to provide space for forced air or heat sinks to dissipate heat from the devices. The use of an internal cavity in the circuit board to remove heat from the devices allows the packing density to be increased while providing adequate heat removal without significantly increasing the manufacturing cost.

Figure 3:
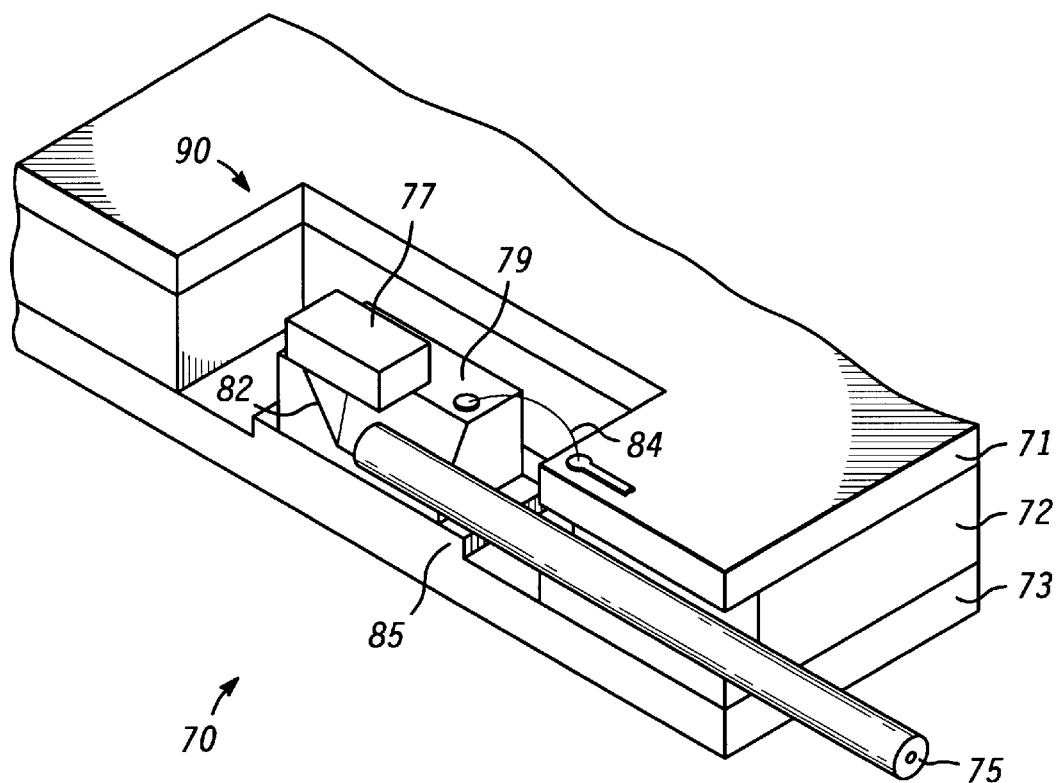
FIG. 3 is a cross-sectional isometric view of yet another circuit board.

FIG. 3 is a cross-sectional isometric view of a circuit board 70 for transporting light energy, comprising layers 71, 72 and 73. A semiconductor device 79 is supported on a surface 85 of layer 73 and has a beveled surface 82 to reflect light signals to or from a photoactive semiconductor device 77. Typically, device 77 is formed from gallium arsenide to operate as a laser diode, and therefore transmits a light beam toward beveled surface 82. However, the principles of the present invention are equally applicable when device 77 is configured as a photodetector to receive light.

Semiconductor device 79 typically is formed from silicon and may include electrical circuitry for receiving or transmitting signals to circuit board 70 through wire bond 84. Device 77 is mounted face-to-face with device 79 such that bonding pads of devices 77 and 79 are aligned and secured using a standard solder bump process. The electrical circuitry of device 79 can be used to control or modulate the light beam produced by device 77.

The conduction medium for the light beam is an optical fiber 75, which is disposed in a medium transport cavity 80 formed as described above by milling a portion of layer 72 to form a channel that runs parallel to surface 85. Optical fiber 75 is held in place by a groove 88 formed in semiconductor device 79. Optical fiber 75 typically has a diameter of approximately 50.0 micrometers. In one embodiment, cavity 80 is routed out to a diameter of approximately 60.0 micrometers and a length of 3.0 centimeters. Optical fiber is secured in cavity 80 using an adhesive such as is used for laminating layers 71–73 to form circuit board 70. Optical fiber 75 is routed through cavity 80 to the edge of circuit board 70, where the end of optical fiber 75 is polished and coupled to a standard edge connector (not shown). This optical transport structure is readily extended to routing a multiplicity of optical fibers through a manifold of respective cavities which can be merged in a single outlet cavity and are joined to form a multiple-strand fiber optic cable at the edge of circuit board 70.

Where semiconductor device 77 operates as a laser diode to emit a light signal, operation of circuit board 70 is as follows. The light signal is transmitted to surface 82 of device 79, where it is reflected in a direction parallel to surface 85 and coupled longitudinally into optical fiber 75 disposed in cavity 80. The light signal is transported through optical fiber 75 to an external edge connector or other device for receiving the light signal. Circuit board 70 thus functions as a protective housing which eliminates the need to encase optical fiber 75 in a separate protective jacket. Cavity 80 provides the further advantage of self-alignment of optical fiber 75 with respect to surface 82 to maintain a longitudinal orientation for improved light transmission.

By now it should be appreciated that the present invention provides a circuit board and method in which a conduction medium is transported through a medium transport cavity in the circuit board to operate a semiconductor device supported on a surface of the circuit board. The medium transport cavity has a portion that runs parallel to the surface of the circuit board, and therefore has a length greater than the thickness of the circuit board. The conduction medium can include such media as air, a coolant fluid, or an optical fiber, for coupling a force or energy such as pressure/vacuum, sound, heat or light from an external source to the semiconductor device. The placement of the medium transport cavity is highly flexible and can be achieved without degrading the electrical performance of the circuit board or semiconductor device. The medium transport cavity is formed using standard circuit board fabrication equipment, and therefore does not significantly increase the cost of the circuit board.

What is claimed is:

1. A circuit board for supporting a semiconductor device, comprising a substrate that is one of fiberglass, teflon-glass, or ceramic wherein the substrate has a thickness and a cavity extending from a first surface of the substrate for a distance greater than the thickness of the substrate.

2. The circuit board of claim 1, further comprising a connector disposed at a first opening of the cavity for receiving a pressure.

3. The circuit board of claim 1, further comprising a connector coupled to a first opening of the cavity where the semiconductor device is disposed over a second opening of the cavity for receiving a vacuum.

4. The circuit board of claim 1, further comprising an optical fiber disposed in the cavity for optically coupling to the semiconductor device.

5. The circuit board of claim 1, further comprising:
   a first connector disposed at a first opening of the cavity for receiving a coolant fluid; and
   a second connector disposed at a second opening of the cavity for circulating the coolant fluid through the cavity to transfer heat between the semiconductor device and the coolant fluid.

6. The circuit board of claim 1 further including the semiconductor device on a second surface of the substrate and coupled to the cavity.

7. A circuit board for mounting a semiconductor device on a surface, comprising a substrate having a cavity where a portion of the cavity runs parallel to the surface of the circuit board wherein the substrate is devoid of materials consisting essentially of silicon.

8. The circuit board of claim 7, further comprising a connector disposed at a first opening of the cavity for receiving a pressure.

9. The circuit board of claim 7, wherein the semiconductor device is disposed over a first opening of the cavity, and further comprising a connector disposed at a second opening of the cavity for coupling a vacuum to the semiconductor device.

10. The circuit board of claim 9, further comprising a wiring trace disposed on the surface of the circuit board such that a contact resistance between the wiring trace and a lead of the semiconductor device is reduced when the vacuum is applied.

11. The circuit board of claim 7, further comprising an optical fiber routed through the cavity for optically coupling to the semiconductor device.

12. The circuit board of claim 7, further comprising:
a first connector disposed at a first opening of the cavity for receiving a coolant fluid; and
a second connector disposed at a second opening of the cavity for circulating the coolant fluid through the cavity to transfer heat between the semiconductor device and the coolant fluid.

13. A circuit board for mounting a semiconductor device on a surface, comprising a substrate having a cavity where a portion of the cavity runs parallel to the surface of the circuit board and wherein the substrate is formed by laminating first and second layers of a fiberglass material.

14. The circuit board of claim 13, wherein the cavity is formed by milling a portion of a first surface of the first layer of the substrate.

15. The circuit board of claim 14, wherein the second layer has a first surface that functions as the surface of the substrate and a second surface opposite to the first surface for laminating to the first surface of the first layer to enclose the cavity.

16. The circuit board of claim 15, further comprising a wiring trace disposed on the first surface of the second layer of the substrate for electrically coupling to the semiconductor device.

17. The circuit board of claim 7 further including the semiconductor device on another surface of the substrate and coupled to the cavity.

* * * * *